(12) United States Patent
Lhommeau

(10) Patent No.: US 9,198,295 B2
(45) Date of Patent: Nov. 24, 2015

(54) PRINTED CIRCUIT COMPRISING AT LEAST ONE CERAMIC COMPONENT

(75) Inventor: Tony Lhommeau, Lieusaint (FR)

(73) Assignee: LABINAL POWER SYSTEMS, Blagnac (FR)

( * ) Notice: Subject to any disclaimer, the term of this patent is extended or adjusted under 35 U.S.C. 154(b) by 56 days.

(21) Appl. No.: 13/818,825

(22) PCT Filed: Aug. 23, 2011

(86) PCT No.: PCT/FR2011/051950
§ 371 (c)(1),
(2), (4) Date: Feb. 25, 2013

(87) PCT Pub. No.: WO2012/025693
PCT Pub. Date: Mar. 1, 2012

(65) Prior Publication Data
US 2013/0146348 A1    Jun. 13, 2013

(30) Foreign Application Priority Data

Aug. 25, 2010  (FR) .................................... 10 56769

(51) Int. Cl.
| | | |
|---|---|---|
| *H01R 9/00* | (2006.01) | |
| *H05K 1/18* | (2006.01) | |
| *H01G 2/06* | (2006.01) | |
| *H05K 3/34* | (2006.01) | |
| *H01G 4/12* | (2006.01) | |
| *H01G 4/228* | (2006.01) | |

(52) U.S. Cl.
CPC .............. *H05K 1/181* (2013.01); *H01G 2/065* (2013.01); *H01G 4/12* (2013.01); *H01G 4/228* (2013.01); *H05K 3/3426* (2013.01); *H05K 2201/10909* (2013.01)

(58) Field of Classification Search
CPC ............... H05K 1/181; H05K 3/3426; H05K 2201/10909; H01L 23/49548; H01L 23/495; H01F 2027/295; H01G 2/065; H01G 11/22; H01G 4/228; H01G 4/2325
USPC ................................................. 361/772, 773
See application file for complete search history.

(56) References Cited

U.S. PATENT DOCUMENTS 3,953,647 A * 4/1976 Brennan et al. ............... 428/378
4,134,759 A * 1/1979 Yajima et al. .................... 419/17
4,470,063 A * 9/1984 Arakawa et al. .............. 257/746

(Continued)

FOREIGN PATENT DOCUMENTS

| JP | 61-149449 | 7/1986 |
| JP | 63-245811 | 10/1988 |
| JP | 10-275740 | 10/1998 |

OTHER PUBLICATIONS

International Search Report as issued fro PCT/FR2011/051950.

*Primary Examiner* — Steven T Sawyer
(74) *Attorney, Agent, or Firm* — Pillsbury Winthrop Shaw Pittman LLP

(57) ABSTRACT

A printed circuit includes a substrate onto which at least one ceramic component is attached so as to enable the heat produced by the ceramic component to be discharged and to prevent cracks in the ceramic component and in the substrate. To this end, the ceramic component is attached onto the substrate using two connectors made of metal matrix composite material. The two connectors further have incisions so as to enable the mechanical stresses exerted in the substrate to be carried over into the connectors.

12 Claims, 2 Drawing Sheets

(56) References Cited

U.S. PATENT DOCUMENTS

| | | | |
|---|---|---|---|
| 4,515,866 A * | 5/1985 | Okamoto et al. | 428/614 |
| 5,367,124 A * | 11/1994 | Hoffman et al. | 174/552 |
| 5,588,477 A * | 12/1996 | Sokol et al. | 164/34 |
| 5,626,692 A * | 5/1997 | Rohatgi et al. | 148/538 |
| 6,081,416 A | 6/2000 | Trinh et al. | |
| 6,365,973 B1 | 4/2002 | Koning | |
| 6,384,342 B1 * | 5/2002 | Li | 174/258 |
| 2001/0001258 A1 * | 5/2001 | Ishigaki et al. | 361/502 |
| 2002/0130161 A1 | 9/2002 | Schmitt | |
| 2009/0147440 A1 | 6/2009 | Cygan et al. | |
| 2011/0075386 A1 * | 3/2011 | Tamura et al. | 361/752 |

* cited by examiner

PRINTED CIRCUIT COMPRISING AT LEAST ONE CERAMIC COMPONENT

CROSS-REFERENCE TO RELATED APPLICATIONS

This is the U.S. National Stage of PCT/FR2011/051950, filed Aug. 23, 2011, which in turn claims priority to French Patent Application No. 1056769, filed Aug. 25, 2010, the entire contents of all applications are incorporated herein by reference in their entireties.

TECHNICAL FIELD

The present invention relates to a printed circuit comprising at least one electronic or electric ceramic component. More specifically, the present invention relates to an assembling solution for electric or electronic ceramic components on a printed circuit, especially when the printed circuit is in an on-board harsh environment, for example in a turbojet engine.

PRIOR ART

The use of ceramic capacitors on electronic boards or assemblies raises problems of reliability, partly due to the fragility of the material of the ceramic capacitors. Indeed, the ceramic does not support mechanical stresses above its elastic limit and therefore, it tends to crack. These cracks limit the ability of the capacitors and can even cause a dielectric breakdown. This problem is particularly important in capacitors larger than 1 cm.

Similarly, ceramic resistors have reliability problems when mounted on printed circuit boards. This problem is commonly observed when the support and the component carried on the support have different thermal expansion coefficients from each other.

Current solutions to address this problem consist of either limiting the size of the components, which also limits their capacity, or using intermediate connectors to attach the ceramic components to their support. These intermediate connectors must have a thermal expansion coefficient close to that of the ceramic to prevent cracking of the ceramic component. Thus, currently, intermediate connectors are made of an alloy such as FeNiCo, which has a thermal expansion coefficient of approximately 6 ppm/K.

However, the applicant has found that the use of such intermediate connectors leads to the heating of the ceramic components, which can lead to a decrease in their capacity. In particular, when several ceramic components are connected in parallel via two FeNiCo connectors, the applicant has found that the component mounted in parallel farthest from the support warmed more than the component mounted in parallel nearest from the support. This temperature distribution limits the number of components that can be mounted in parallel. In addition, this temperature distribution can cause a decrease in the capacity of the capacitor located farthest from the support and in particular when reaching a temperature greater than 125° C. The applicant has also found that the use of prior art connectors could increase thermo-mechanical stresses in the ceramic component.

SUMMARY OF THE INVENTION

The invention aims to overcome, at least partially, the disadvantages of the prior art by providing a printed circuit on which ceramic components of all sizes can be attached.

Another object of the invention is to provide a printed circuit on which ceramic components can be attached with a reduced risk of cracks in these ceramic components.

Another object of the invention is to provide means for attaching a ceramic component on a printed circuit that can limit the heating of the component.

Another object of the invention is to provide means for attaching several ceramic components in parallel on a printed circuit that can limit the heating of the ceramic component farthest from the support.

Another object of the invention is to provide a printed circuit on which the ceramic components are securely attached.

Another object of the invention is to provide a printed circuit on which mechanical stresses are reduced.

To do this, is provided, according to a first aspect of the invention, a printed circuit comprising a support on which is mounted at least one ceramic component, wherein the ceramic component is attached to the support by means of two connectors, each connector being made of a metal matrix composite material.

The choice of a connector made of a metal matrix composite material is particularly advantageous because it has a thermal expansion coefficient close to that of the ceramic, and therefore, it can reduce the risk of cracks in the ceramic component.

In addition, a connector made of a metal matrix composite material has a high thermal conductivity, and therefore provides a good discharge of heat from one or more ceramic components, including when the ceramic components are connected in parallel. Indeed, connectors made of a metal matrix composite material have thermal conductivities greater than 300 W/mK, which significantly reduces self-heating of the ceramic component while maintaining its mechanical integrity since cracking is prevented.

Furthermore, connectors made of a metal matrix composite material can have a uniform temperature across the printed circuit despite significant variations in term of geometry between the printed circuit and the first component.

Furthermore, the invention allows the connection of a large number of ceramic components in parallel between the two connectors, since the heat of the ceramic component located farthest from the support may be discharged by means of the connectors made of a ceramic matrix composite material.

Advantageously, the metal matrix composite material is selected from the following group: Cu—C, Cu-diamond, Al—C, Al—SiC, Al-diamond. It is understood that the term "Cu—C" means a composite material having a copper matrix and a carbon reinforcement. Similarly, for the other composite materials cited: the chemical element named first refers to the element that forms the matrix and the second chemical element named is the element that constitutes the reinforcement.

The choice of these materials for connectors can give connectors that have a thermal expansion coefficient of between 6 and 16 ppm/K and a thermal conductivity above 150 W/mK, which allows both to avoid cracks in the ceramic components, and to remove heat produced by these ceramic components.

According to a preferred embodiment, each connector comprises a base located between the ceramic component and the support, the base being cut via a notch. This notch in the base of each connector allows to limit the mechanical and thermal stresses in the support. Indeed, this notch allows to transfer stresses, which are normally present in the support, to the base, at the notch. However, as the connectors are more resistant than the support, it can also increase the life of the printed circuit.

These notches are only possible because the connectors have a good thermal conductivity. Indeed, if this was not the case, the fact of reducing the base section of each conductor would prevent heat being discharged from ceramic components and therefore, would lead to the heating of the ceramic components.

Advantageously, the support extends parallel to a XZ plane, the ceramic component extending parallel to the X-axis, the connectors extending parallel to a Y-axis perpendicular to the XZ plane.

Advantageously, the notch defines three zones in the base of each connector:
- a portion of reduced section, located at the notch;
- a foot and a connection, located on both side of the portion of reduced section and thus represent a greater section than that of the portion of reduced section.

When a notch is made in the connector, it preferably extends along the X-axis.

Advantageously, the foot is also cut into several tabs. Advantageously, this cutting takes place in a direction perpendicular to the direction of the notch. Therefore, the foot is preferably cut along the Z-axis.

This division of the foot, for example by slot, reduces the thermo-mechanical stresses in the foot, along the cutting axis, which makes it possible to increase the life of the assembly.

According to various embodiments:
- the foot can be directed to the ceramic component, that is to say that the foot is formed by the portion of the base located between the notch and the support, in the continuity of the connector, and this embodiment allows a saving of space; or
- the foot can be unfolded outwardly from the ceramic component, that is to say that the foot is rotated so as to be at 180° from the previous position. In this case, the foot is no longer under the ceramic component; this embodiment allows a better attachment of the connectors to the support.

The invention relates especially to the case wherein the ceramic component is a ceramic capacitor.

Advantageously, at least two ceramic components are connected in parallel by means of the two connectors. Indeed, the invention allows to connect several ceramic components in parallel, without heating the ceramic component located farthest from the support to a temperature above to that of the ceramic component located closest to the support.

Advantageously, the base has a height, along the Y-axis, greater than 4 mm.

Advantageously, the notch is at a distance, along the Y-axis, from the component closest to the support, of between 2 mm and 6 mm, which allows to avoid the thermo-mechanical stresses of the connector after attachment to the support.

Advantageously, the connector has a thickness, along the X-axis, of about 2 mm.

Advantageously, the portion of reduced section has a thickness, along the axis X, of between 0.25 and 1 mm, to limit thermomechanical stresses and increase the life of the component.

The invention also relates to the use of a metal matrix composite material for connecting a ceramic component to a support in a printed circuit.

The invention also relates to the use of one of these metal matrix composite materials for connecting a ceramic component to a support in a printed circuit: Cu—C, Cu-diamond, Al—C, Al—SiC, Al-diamond.

The invention also relates to the use of a metal matrix composite material for connecting several ceramic components in parallel to a support in a printed circuit.

BRIEF DESCRIPTION OF THE FIGURES

Further features and advantages of the invention will become apparent upon reading the detailed description that follows, with reference to the accompanying figures.

For clarity, the same or similar elements are designated by identical reference signs on all figures.

DETAILED DESCRIPTION OF AT LEAST ONE EMBODIMENT

Figure 1:
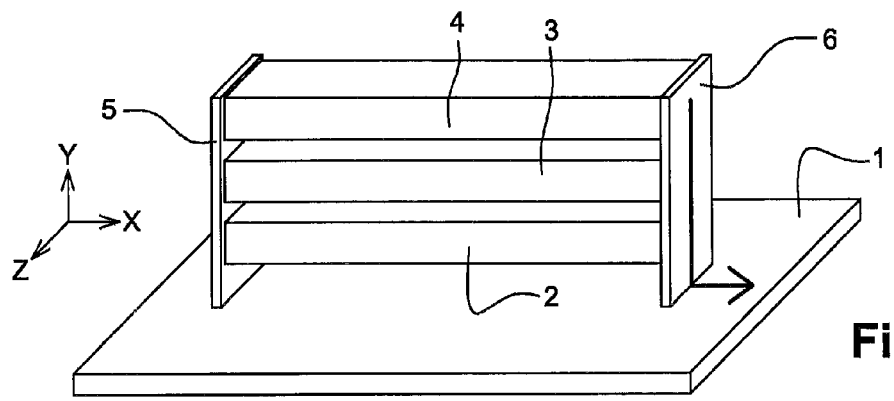
FIG. 1 is a perspective view of a printed circuit according to an embodiment of the invention.
Figure 2:
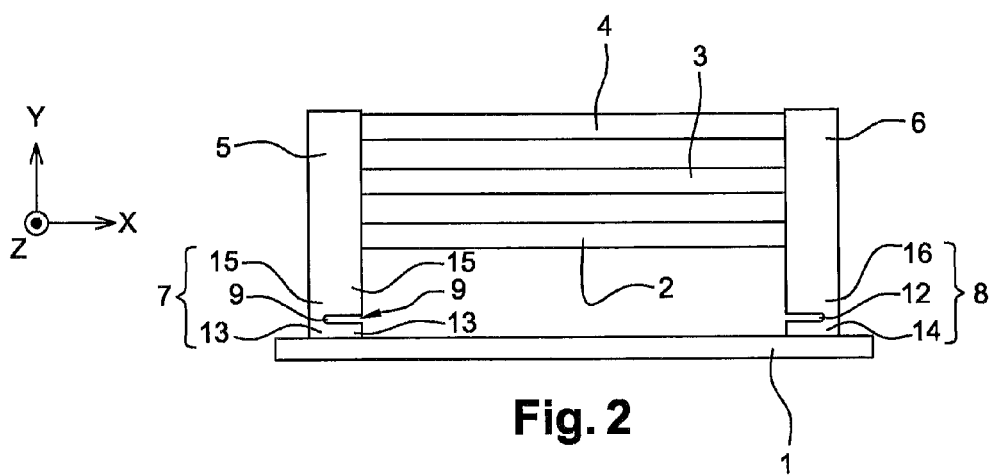
FIG. 2 is a front view of the printed circuit of FIG. 1.

FIGS. 1 and 2 show a printed circuit according to a first embodiment of the invention. This printed circuit comprises a support (1). This support (1) is preferably composed of an assembly of one or more thin layers of copper separated by an insulating material. This insulating material can, for example, be a polyamide, an epoxy resin or glass fibres. The support (1) has generally a coefficient of between 4 and 25 ppm/K.

The support (1) is parallel to a XZ plane.

The printed circuit also comprises three ceramic components (2, 3, 4) connected in parallel to the support (1). In this example, the number of ceramic components connected in parallel is equal to 3, but a different number of ceramic components could be chosen without departing from the scope of the invention. Usually, a number n of ceramic components could be connected in parallel, wherein n is 1 or above.

Ceramic components (2, 3, 4) are, in this embodiment, ceramic capacitors, but the invention could also be performed with other types of ceramic components, e.g. with ceramic resistors.

Each ceramic component extends parallel to the X-axis.

The three ceramic components (2, 3, 4) are connected to the support (1) by means of two connectors (5 and 6), each of which extends parallel to the Y-axis.

The invention is particularly noteworthy in that each connector (5, 6) consists of a metal matrix composite material. This metal matrix composite material is preferably one of the following materials: Cu—C, Cu-diamond, Al—C, Al—SiC, Al-diamond.

Thus, each connector (5, 6) has a thermal expansion coefficient, along the Y and Z-axes, which is similar to the thermal expansion coefficient of the ceramics. Indeed, each connector (5, 6) has a thermal expansion coefficient along the Y and Z axes, in the range between 8 and 16 ppm/K, which can limit thermo-mechanical stresses during assembly of the ceramic components (2, 3, 4) on the support (1). Thus, the presence of connectors (5, 6) can reduce the risk of cracks in the ceramic components due to the difference in the thermal expansion coefficient between the support (1) and the ceramic components (2, 3, 4).

In addition, each connector (5, 6) thus has a thermal conductivity greater than 150 W/mK, along the Y and Z-axes, which can promote the dissipation of heat flow. Therefore, the heat generated by each of the ceramic components (2, 3, 4) can be discharged through the connectors 5 and 6, which prevents overheating of the ceramic components (2, 3, 4). Therefore, the invention allows the connection in parallel of a large number of ceramic components, because even when a large number of ceramic components are stacked, the heat produced can be discharged.

Each connector (5, 6) can be attached to the support (1) by soldering, brazing, welding, gluing or any other assembling means usually used to attach a component to a printed circuit.

Similarly, each ceramic component (2, 3, 4) can be secured to each connector (5, 6) by soldering, brazing, welding, gluing or any other assembling means usually used to attach a component to a connector.

Each connector (5, 6) has a base (7, 8). The base (7, 8) is the portion of the connector (5, 6) that is located between the support (1) and the ceramic component (2) closest to the support (1). The base (7, 8) has preferably a height, along the Y-axis, of at least 4 mm to allow the circulation of air between the ceramic component and the support and reduce thermo-mechanical stresses between the support and the ceramic component (2) closest to the support.

Each base (7, 8) is preferably incised, along the X-axis, by a notch (9, 10). The bottom of each notch (9, 10) is preferably round to prevent the connector from breaking at the notch (9, 10). Each notch (9, 10) divides the base (7, 8) to which it belongs into three zones:
 a part of reduced section (11, 12);
 a foot (13, 14), located near the support,
 a connection (15, 16) located near the ceramic component.

Each connector (5, 6) has preferably a thickness, along the X-axis, substantially equal to 2 mm.

In this case, the notches 9 and 10 are preferably made so that each portion of reduced section (11, 12) has a thickness, along the X-axis, of between 0.25 and 1 mm. The presence of this notch (9, 10) allows to transfer thermo-mechanical stresses, which are normally present in the support, to the foot (13, 14) of the connector (5, 6). However, as the connectors (5, 6) are mechanically more resistant than the support, the postponement of thermo-mechanical stresses can increase the lifetime of the printed circuit.

In addition, the notch (9, 10) is preferably performed at a distance, along the Y-axis, from the ceramic component (2) closest to the support (1), which is between 2 and 6 mm in order to limit thermo-mechanical stresses after attachment of the ceramic component (2) to the connector (5, 6).

In addition, ceramic components (2, 3, 4) are preferably sufficiently far apart from each other to allow air to circulate between them. Therefore, the ceramic components (2, 3, 4) are preferably separated by a distance, along the Y-axis, of between 0.5 and 1 mm.

Figure 3:
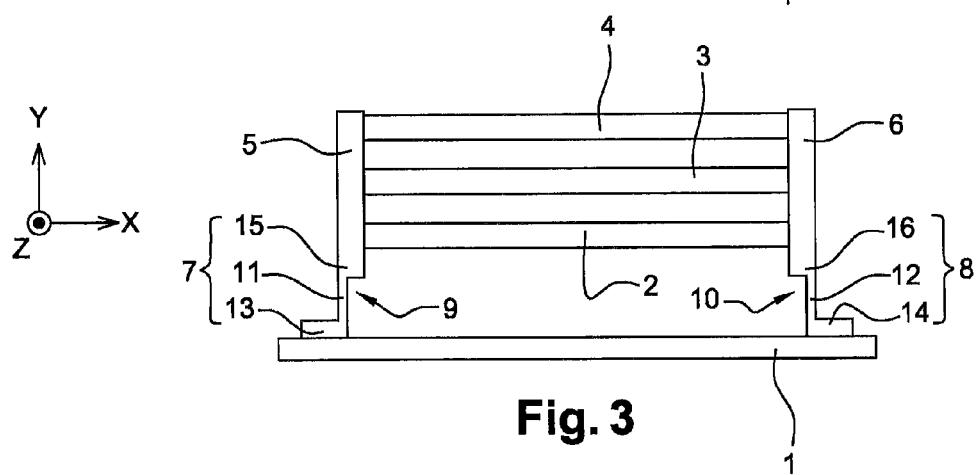
FIG. 3 is a front view of a printed circuit according to another embodiment of the invention.
Figure 4:
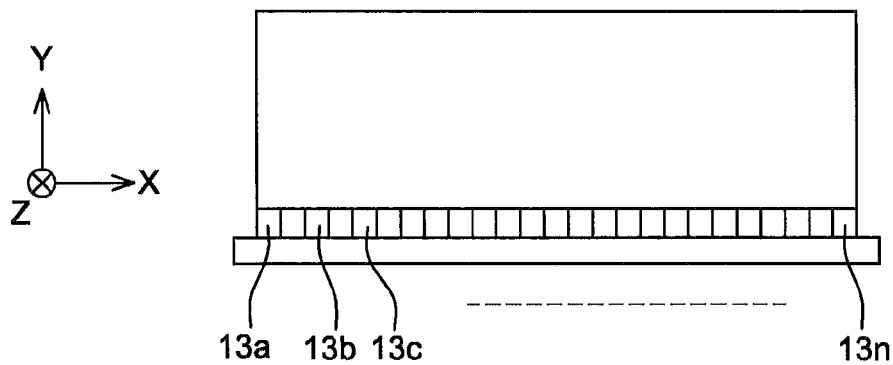
FIG. 4 is a side view of the printed circuit of FIG. 3.
Figure 5:
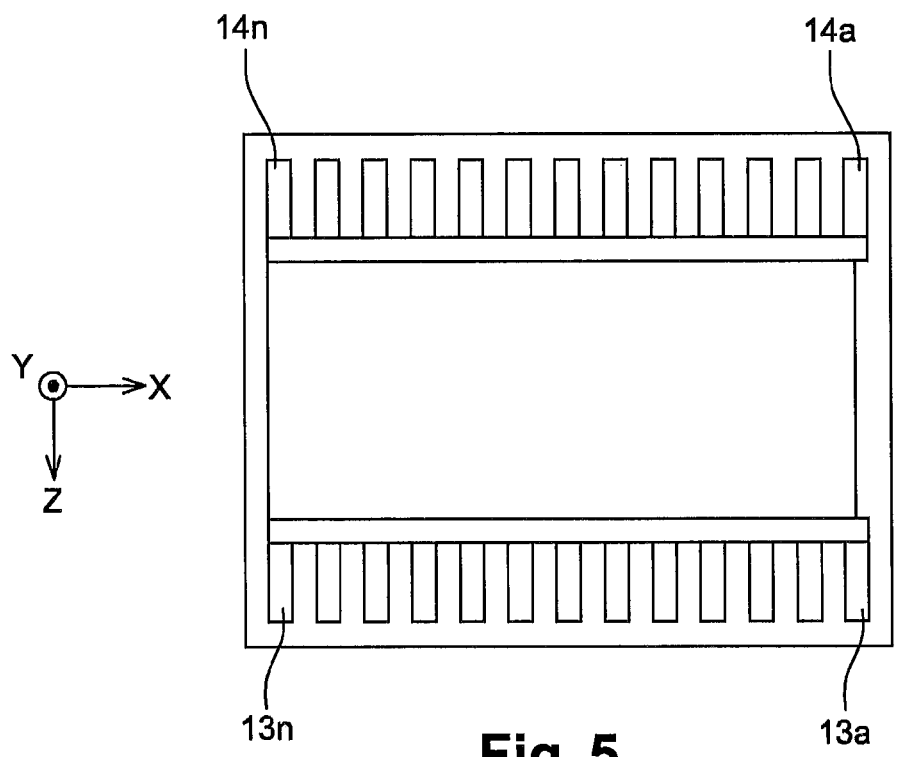
FIG. 5 is a top view of the printed circuit of FIG. 3.

FIGS. 3 to 5 show another embodiment in which the base (7, 8) on each connector (5, 6) shows another form than the one in the embodiment of FIGS. 1 and 2. In this embodiment, the foot (13, 14) of each base (7, 8) is not in line with each connector (5, 6), but turned towards the outside of the ceramic components (2, 3, 4). More specifically, in the embodiment of FIGS. 1 and 2, the foot (13) is in the continuity of the connector 5 and is directed along the +X-axis. In contrast, in this embodiment, the foot (13) is bent at 180° compared with the foot of FIGS. 1 and 2, so that the foot (13) is directed along the −X-axis. The same applies to foot 14 which in the embodiment of FIGS. 1 and 2 is directed along the —X-axis, while in this embodiment, the foot 14 is bent to 180° compared with the embodiment of FIGS. 1 and 2 so as to be directed along the +X-axis.

In addition, as can be seen more clearly in FIGS. 4 and 5, each foot (13, 14) is cut, along the Z-axis, into several tabs (13-13n, 14n-14a) respectively. The feet (13 and 14) are preferably slot cut. This cutting allows the feet to reduce thermo-mechanical stresses along the Z-axis, which increases the lifetime of the assembly between the connectors (5, 6) and the support (1).

It could also be considered to cut the feet (13 and 14) of the printed circuit of FIGS. 1 and 2 to reduce stresses along the Z-axis in this embodiment as well.

Naturally, the invention is not limited to the embodiments described with reference to the figures, and variations could be envisaged without departing from the scope of the invention. One example would be to connect a single electronic component to the support. Notches with other geometries could also be performed in each base. In addition, cutting the feet following the Z-axis could take other forms.

The invention claimed is:

1. A printed circuit comprising a support on which is mounted at least one ceramic component, wherein the ceramic component is attached to the support with two connectors, and wherein each connector is made of a metal matrix composite material, the metal matrix composite material being selected from the following group:
 a composite material having a copper matrix and a carbon reinforcement; a composite material having a copper matrix and a diamond reinforcement; a composite material having an aluminum matrix and a carbon reinforcement; a composite material having an aluminum matrix and a SiC reinforcement; a composite material having an aluminum matrix and a diamond reinforcement; wherein each connector comprises a base located between the ceramic component and the support, wherein the base is cut via a notch; wherein the notch defines three zones in the base of each connector: a portion of reduced section, located at the notch, a foot and a connection located on both sides of the portion of reduced section.

2. The printed circuit according to claim 1, wherein the foot is cut into several tabs.

3. The printed circuit according to claim 1, wherein the foot is further unfolded outwardly from the ceramic component.

4. The printed circuit according to claim 1, wherein the ceramic component is a ceramic capacitor.

5. The printed circuit according to claim 1, wherein at least two ceramic components are connected in parallel with the two connectors.

6. A turbojet engine comprising a printed circuit according to claim 1.

7. The printed circuit according to claim 1, wherein a height of the base from the support to the ceramic component is at least 4 mm.

8. The printed circuit according to claim 1, wherein each connector has a thickness that is substantially equal to 2 mm.

9. The printed circuit according to claim 1, wherein a thickness of the portion of reduced section is between 0.25 and 1 mm.

10. The printed circuit according to claim 5, wherein the at least two ceramic components are separated from each other by a distance between 0.5 and 1 mm.

11. A method comprising connecting a ceramic component to a support in a printed circuit using a metal matrix composite material, wherein the metal matrix composite material is selected from the following group: a composite material having a copper matrix and a diamond reinforcement; a composite material having an aluminum matrix and a carbon reinforcement; a composite material having an aluminum matrix and a SiC reinforcement; a composite material having an aluminum matrix and a diamond reinforcement; wherein each connector comprises a base located between the ceramic component and the support, wherein the base is cut via a notch; wherein the notch defines three zones in the base of each connector: a portion of reduced section, located at the notch, a foot and a connection located on both sides of the portion of reduced section.

12. A method comprising connecting several ceramic components in parallel to a support in a printed circuit using a metal matrix composite material; wherein the metal matrix composite material is selected from the following group:

a composite material having a copper matrix and a diamond reinforcement; a composite material having an aluminum matrix and a carbon reinforcement; a composite material having an aluminum matrix and a SiC reinforcement; a composite material having an aluminum matrix and a diamond reinforcement; wherein each connector comprises a base located between the ceramic component and the support, wherein the base is cut via a notch; wherein the notch defines three zones in the base of each connector: a portion of reduced section, located at the notch, a foot and a connection located on both sides of the portion of reduced section.

\* \* \* \* \*